United States Patent [19]

Jin

[11] Patent Number: 4,605,911
[45] Date of Patent: Aug. 12, 1986

[54] MAGNETIC BIAS AND DELAY LINEARITY IN A MAGNETOSTATIC WAVE DELAY LINE

[75] Inventor: Korda K. Jin, Brea, Calif.

[73] Assignee: The United States of America as represented by the Secretary of the Air Force, Washington, D.C.

[21] Appl. No.: 664,193

[22] Filed: Oct. 24, 1984

[51] Int. Cl.[4] ............................................. H03H 9/38
[52] U.S. Cl. .................................... 333/144; 333/148; 333/156; 310/311
[58] Field of Search ............... 333/148, 147, 201, 141, 333/144, 145, 24.1, 158, 150, 152; 310/26, 311, 321, 322

[56] References Cited

U.S. PATENT DOCUMENTS

| | | | |
|---|---|---|---|
| 2,814,793 | 11/1957 | Bonn | 333/144 X |
| 3,225,312 | 12/1965 | Tellerman | 333/148 X |
| 3,244,993 | 5/1966 | Schloemann | 333/148 X |
| 3,290,649 | 12/1966 | Whitehouse | 333/141 X |
| 3,309,628 | 3/1967 | Olson | 333/144 |
| 3,383,632 | 5/1968 | Sparks et al. | 333/147 |
| 3,444,484 | 5/1969 | Bierig | 333/24.1 X |
| 3,480,888 | 11/1969 | Elliott | 333/207 X |
| 3,530,409 | 9/1970 | Vasile | 333/147 |
| 3,617,949 | 11/1971 | Kameya | 333/140 |
| 3,707,689 | 12/1972 | Morgenthaler | 333/147 |
| 3,895,324 | 7/1975 | Morgenthaler | 333/147 |
| 3,911,380 | 10/1975 | Lavedan, Jr. | 333/158 |
| 3,946,340 | 3/1976 | Simon | 333/24.1 |
| 4,093,929 | 6/1978 | Morgenthaler | 333/156 |
| 4,152,676 | 5/1979 | Morgenthaler et al. | 333/24.1 |
| 4,152,677 | 5/1979 | Chiron et al. | 333/24.2 |
| 4,165,498 | 8/1979 | Hongu | 333/148 X |

Primary Examiner—Eugene R. LaRoche
Assistant Examiner—Benny Lee
Attorney, Agent, or Firm—Donald J. Singer; Gerald B. Hollins

[57] ABSTRACT

A cascade combination of magnetostatic delay line elements operating in different signal propagation modes for the purpose of achieving dispersion cancellation; magnetic bias control of the attained frequency-dependent delay and a magnetic bias field establishing apparatus for providing the tubular, laminar magnetic flux needed for backward volume wave operation of a magnetostatic delay element are also included.

21 Claims, 4 Drawing Figures

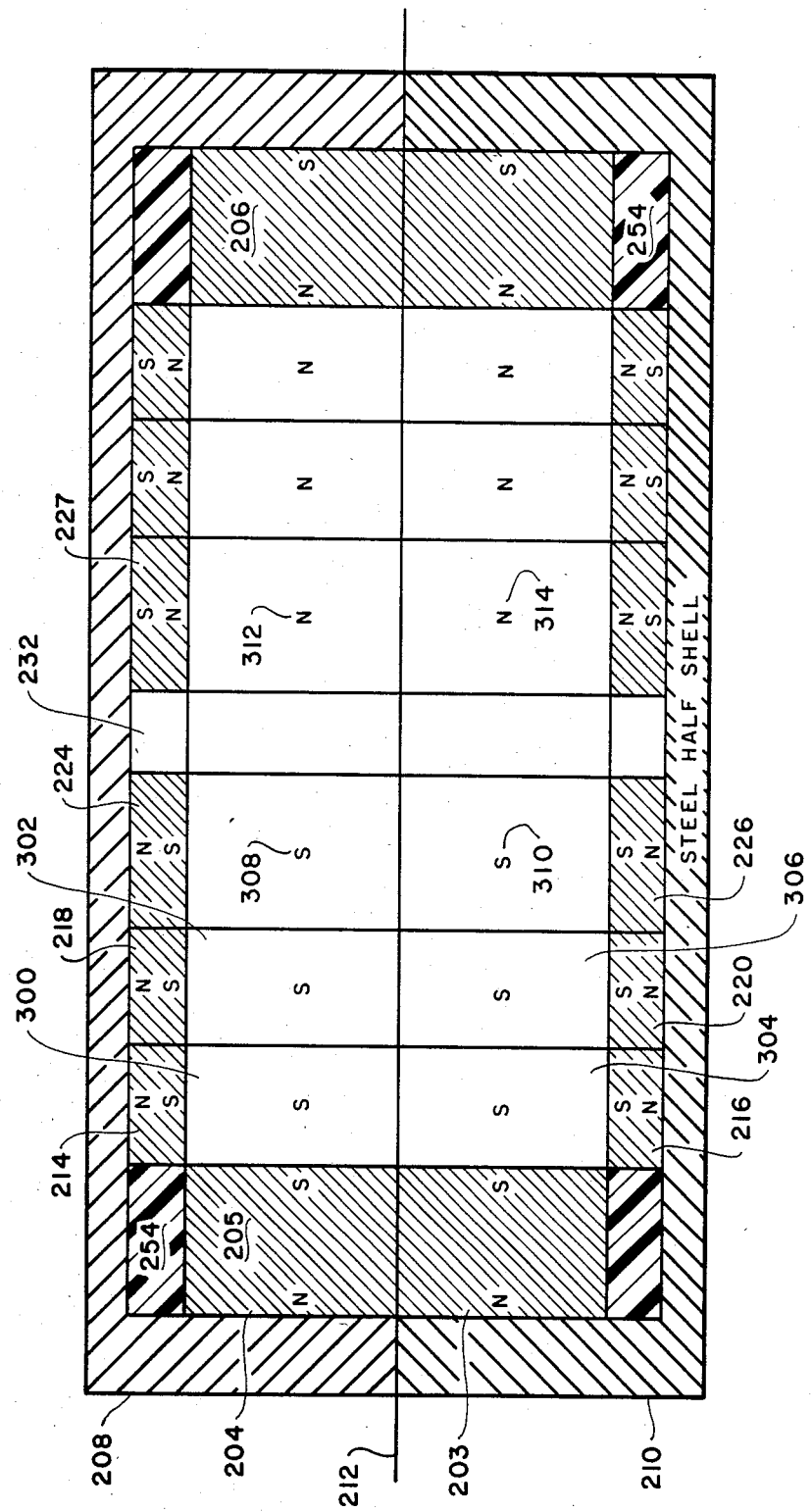

MAGNETIC BIAS AND DELAY LINEARITY IN A MAGNETOSTATIC WAVE DELAY LINE

RIGHTS OF THE GOVERNMENT

The invention described herein may be manufactured and used by or for the Government of the United States for all governmental purposes without the payment of any royalty.

BACKGROUND OF THE INVENTION

This invention relates to the field of electrical delay lines wherein signal delay is achieved by propagation through a ferrimagnetic film such as a magnetic garnet and to achieving the parallel magnetic field employed with such delay lines operating in the backward volume wave operating mode.

Magnetostatic wave delay lines find increasing use in the processing of electronic signals in such applications as signal correlation, where two periodically occurring signals are compared in order that properties such as signal source movement, strength change, or source velocity change be detectable. The magnetostatic wave delay line is additionally found useful for phasing signals in a multiply arrayed antenna system operated in the higher frequencies used for radar and other line-of-sight communication.

Applications of the magnetostatic delay line are limited by a fundamental property of magnetostatic device technology concerning time delay characteristics. According to this limitation the delay vs. frequency characteristics of a magnetostatic propagating wave is neither constant nor linearly varying with respect to frequency. Such non-linearity is known as the dispersive behavior of a magnetostatic delay line; that is, the phase velocity and the signal group velocity in a magnetostatic delay line are found to be unequal.

A promising arrangement for linearizing behavior of a magnetostatic delay line is found in the technique of dispersion cancellation. According to this technique, two magnetostatic delay lines of for example, yttrium iron garnet (YIG) are employed in cascade or tandem, with one YIG element biased using a magnetic field which is parallel to the direction of signal propagation, while the other is biased with a magnetic field perpendicular to the direction of signal propagation. In this arrangement, the parallel magnetic field generates a magnetostatic backward volume wave (MSBVW) while the perpendicular magnetic field generates either a magnetostatic surface wave (MSSW) or a magnetostatic forward volume wave (MSFVW). The time delay vs. frequency characteristics of the MSBVW propagating wave and that of either of the latter two types of propagations are oppositely sloped in a YIG element to a degree permitting cancellation of the dispersive characteristics and allowing a delay line employing the combination of propagation modes to have a relatively constant delay over at least a limited frequency range. A problem in achieving this desirable dispersion cancellation arrangement is concerned with the need to produce a parallel magnetic field suitable for achieving the magnetostatic backward volume wave (MSBVW) mode of operation; such a field must be long, narrow, and uniform over the body of the MSBVW element.

The patent prior art includes several examples of magnetostatic delay line devices and arrangements for achieving the desired magnetic field for such devices; these examples include the patent of W. S. Elliott, U.S. Pat. No. 3,480,888, which describes a YIG element used with a biasing magnetic field to embody an electronically tuned wave filter whose passband center frequencies can be varied by changing the strength of the biasing DC magnetic field. The Elliott invention contemplates the filter element to be in the form of a sphere and for this sphere to be located in a solenoidal electromagnet. The solenoidal electromagnet has a degree of uniform magnetic field intensity over its internal cross-section and changes in this field intensity are used in the Elliott invention to change the center frequency of the filter element.

An example of a YIG element used in combination with a biasing magnetic field to achieve a magnetostatic delay line is found in the patent of C. F. Vasile, U.S. Pat. No. 3,530,409, wherein a pair of permanent magnets are used to bias a slab, bar or cylindrical rod into magnetic saturation in order to achieve a changed spin wave propagation. The Vasile invention contemplates the use of specially tailored magnetic fields in order to achieve desired characteristics from the YIG element, the desired magnetic field being achieved through the use of a second length of poly-crystal YIG material placed adjacent the single-crystal delay line element in order to achieve an increasing bias field in the delay line element.

An example of prior art magnetic field shaping for use with a magnetostatic delay line is found in the patent of Robert A. Moore, U.S. Pat. No. 3,593,215, wherein a YIG delay line element is located between the poles of a bias field magnet. In the Moore invention, the dispersive characteristics of the magnetostatic delay line are improved and controlled by the placement of a ferrite material in intimate contact with the YIG delay line element at its ends in order that the ferrite magnetic field shaping material and the delay line radio frequency energy circuits interpenetrate. The Moore patent also refers to a published magnetic field article titled "Internal Magnetic Field Analysis and Synthesis for Prescribed Magnetostatic Delay Characteristics" appearing in the Journal of Applied Physics, Vol. 37, No. 3, pp. 983-987, March 1966. The Moore patent is concerned with the differences between a YIG element having uniform magnetic field as provided by the two magnet poles of the Moore apparatus and a YIG element subjected to a varying magnetic field through the use of ferrite elements located at the ends of the YIG element. Claim 5 of the Moore patent indicates the presence of a magentic field applied along the YIG element and a magnetic field bias circuit disposed to interpenetrate the radio frequency magnetic field circuit for shaping the applied magnetic field.

Another example of magnetostatic wave delay lines employing magnetic field variations is found in the patent of Frederick R. Morgenthaler, U.S. Pat. No. 3,895,324, which discloses the use of a YIG material doped with gallium and employed in a graduated magnetic field which accomplishes conversion between plural wave propagation modes. The Morgenthaler patent contemplates changes in the effective magnetic field by providing appropriate material graduations, as by doping the YIG material, and further contemplates variation of the wave energy delay within the YIG material by changing the internal magnetic field bias in magnitude and/or direction. The Morgenthaler patent is also concerned with the difference between YIG element internal and external bias fields and provides arrangement for varying the magnetic field through the use of a multilayer structure.

An example of a ferrimagnetic material used in combination with a permanent magnet and a current-carrying electrical conductor is found in the patent of Joseph W. Simon, U.S. Pat. No. 3,946,340, which describes a radio frequency signal phase shifter of the type commonly used in radar systems and achieves temperature compensation of a phase shifter property through the use of a permanent magnet generated bias field.

Another example of apparatus used for generating a magnetic field suitable for biasing a ferrimagnetic crystal such as YIG is found in a second patent of Morgenthaler, U.S. Pat. No. 4,093,929, wherein a ferrimagnetic crystal which is variously labeled as 2A' or 2B, is located axially between two magnetic poles or within an electrical solenoid in order that exposure to a linear longitudinal magnetic bias field be achieved. The Morgenthaler '929 patent describes a detailed mathematical procedure for pole face shaping in order that either a spatially uniform or non-uniform magnetic field encompassing the ferrimagnetic crystal be achieved. The Morgenthaler '929 patent contemplates use of the described magnetic field generating apparatus in delay line and RF filtering applications including delay lines having linear time delay vs. frequency characteristics over an extended bandwidth. The thrust of the Morgenthaler '929 patent is the suitable shaping of the magnetic source pole faces or solenoid geometry in order to achieve a desirable magnetic flux pattern.

Yet another example of ferrimagnetic YIG materials used in combination with externally magnetic fields is found in a third patent of F. R. Morgenthaler, U.S. Pat. No. 4,152,676, which is concerned with the phenomenon of localized, extremely sharp resonances in a single-crystal YIG slab subjected to highly non-uniform demagnetization fields involving a non-ellipsoidal shape. The '676 Morgenthaler patent is concerned with this local resonance in a single crystal in contrast with the uniform precession mode YIG operation wherein all portions of each magnetic element resonate in phase as a result of a uniform internal DC magnetic field. The Morgenthaler '676 patent contemplates the use of DC magnetic fields generated by an electromagnet, these fields being generally perpendicular to the YIG crystal structure, rather than lengthwise along the crystal.

Yet another example of YIG ferrimagnetic material used in combination with permanent magnets forming a bias field is found in the patent of Bernard Chiron, U.S. Pat. No. 4,152,677, which concerns a microwave isolator wherein two YIG elements are subjected to a crosswise oriented magnetic field.

SUMMARY OF THE INVENTION

An object of the present invention is to provide a magnetostatic wave delay line arrangement which achieves delay linearization through the use of dispersion cancellation.

Another object of the invention is to provide a delay line arrangement which combines the magnetostatic backward volume wave and magnetostatic surface wave operating modes.

Another object of the invention is to provide an arrangement for generating long, narrow and uniform magnetic fields suitable for use with magnetostatic backward volume wave delay lines.

Another object of the invention is to provide a controllable laminar magnetic flux generating apparatus which includes first and second sources of magnetomotive force located at displaced points along an axis and polarized to establish magnetic field lines which tend to extend along a curved line pattern together with a controllable source of magnetomotive force dispersed along the axis between the first and second sources and usable for modulating the strength of the magnetic field generated by the first and second sources along with means located along the axis for diverting the curving magnetic field from the curving line pattern to a pattern of lines extending parallel to the axis between the first and second sources and including a cavity receptacle concentric with the axis communicating between this first and second sources which is usable for containing a ferrimagnetic delay line element such as a YIG element.

Another object of the invention is to provide a magnetostatic wave delay line apparatus which comprises means including a primary source of magnetomotive force for generating curved magnetic field lines extending along an axis and having axial position varying field components that are perpendicular to the axis along with means located along the axis for generating a magnetic field that is perpendicular to the axis, opposite in polarity to the position varying flux components and graduated in strength to cancel the position varying flux components, thereby leaving flux that is parallel with the axis and also includes a backward volume wave magnetostatic delay line element lengthwise located in the parallel component magnetic field with electrical signal input and output ports.

BRIEF DESCRIPTION OF THE DRAWINGS

FIG. 3 shows the arrangement of magnetic field shaping magnets used with the magnetostatic backward volume wave delay line.

DETAILED DESCRIPTION

Figure 1:
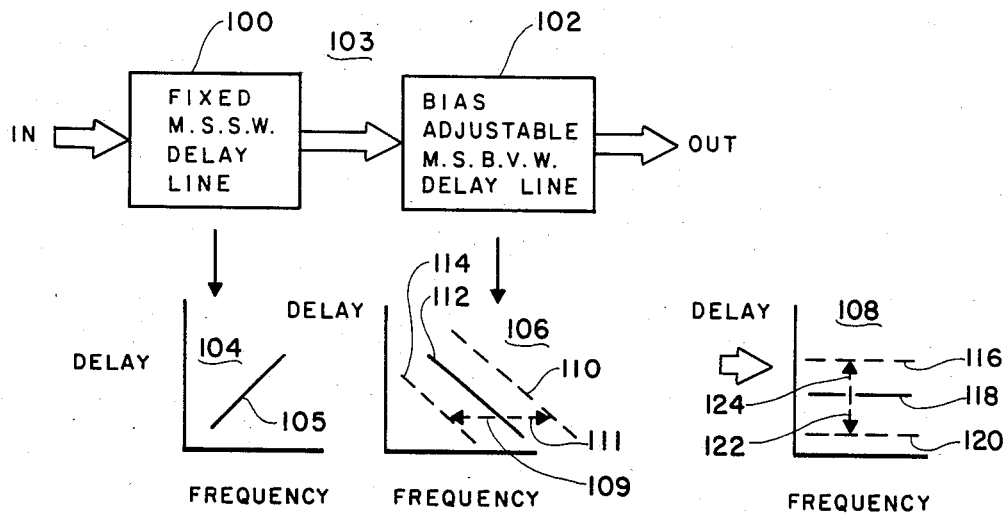
FIG. 1 shows a block diagram and a corresponding delay vs. frequency characterization of delay lines made in accordance with the invention.

The achievement of dispersion cancellation in a series coupled pair of magnetostatic delay lines is indicated for the delay line combination 103 in FIG. 1. This combination includes a fixed delay magnetostatic surface wave delay line 100 operated in conjunction with a magnetic bias adjustable magnetostatic backward volume wave delay line 102. These delay lines are identified as MSSW and MSBVW delay lines in FIG. 1 and in the subsequent description. The characteristics of the delay line combination 103 is shown in the sketches 104, 106 and 108 in FIG. 1 where the frequency dependence of the two difference types of magnetostatic lines is represented by the curves 105, 110, 112 and 114. As indicated by the curve 105 the MSSW and also a MSFVW delay line have a generally positive delay correlation with frequency while the MSBVW delay line has a negative delay to frequency correlation. A suitable combination of such MSSW and MSBVW or MSFVW and MSBVW characteristics can therefore provide a frequency-independent delay as indicated by the characteristic 108 and the curves 116, 118 and 120 in FIG. 1.

As indicated by the plural curves 110, 112 and 114 in the characteristic 106 for the MSBVW delay line, variation of the signal delay provided by lines of this type is also possible in response to changes in the magnetic bias field employed with the delay line element. These variations of magnetic bias field allow the delay characteristics to be shifted along the paths 109 and 111 from a nominal delay value to a shorter or longer delay values without making the otherwise required physical changes to achieve delay variations. This adjustment of magnetic bias field may also be employed in the combined MSBVW and MSSW or MSBVW and MSFVW mode delay line characteristics for variation from the nominal delay, the curve 118, along the paths 122 and 124, and shorter or longer delay times respectively.

Retention of the frequency-independent characteristics of the combined delay lines shown at 108 under conditions of bias field adjustment is of course contingent on the delay vs. frequency characteristic of the MSBVW line, the characteristic 106, having substantially the same slope under differing magnetic bias conditions. The presence of differing slopes in the respective curves 110, 112 and 114 would, of course, change the frequency-independent nature of the curves 116, 118 and 120 in the characteristic 108.

Figure 4:
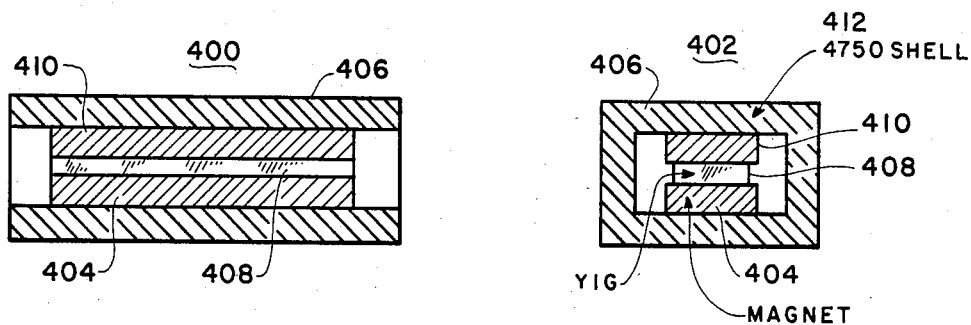
FIG. 4 shows the arrangement of magnetic field generating magnets for magnetostatic surface wave delay line in FIG. 1.

The achievement of two different operating modes in magnetostatic delay lines requires use of two differently oriented magnetic fields with respect to the magnetostatic devices. The achievement of surface wave operating mode for example, involves the creation of a magnetic field which is perpendicular to the direction of wave propagation in a garnet delay line element, while the achievement of backward volume wave operation requires the generation of a magnetic field which is generally parallel to the direction of propagation in the garnet element. These relationships presume that the garnet element is shaped into the form of a slab, a rod or a wedge having a long dimension in the direction of signal propagation. The achievement of surface wave operating mode in a YIG delay line element typically involves the generation of magnetic fields having an intensity of 2500 oersteds across a gap of 1.2 millimeters and over an area of 25 millimeters × 6.5 millimeters. The generation of such fields may employ a structure such as is shown in FIG. 4 of the drawings.

The achievement of backward volume wave operation in a garnet crystal such as YIG is somewhat more complex and involves the generation of a long, narrow and uniform field having field lines which are parallel to the direction of YIG signal propagation. Before describing the FIG. 2 arrangement for achieving a magnetic field of this configuration, however, a brief discussion of magnetic circuit relationships is appropriate.

According to these magnetic circuit relationships, a magnetizing force or magnetomotive force H which may be measured in such units as ampere turns per unit length or oersteds establishes lines of magnetic flux having a density, that is, a number of lines in a square centimeter of flux cross-sectional area, which can be measured in units of gausses and represented by the letter B. This flux density is also related to the magnetizing force H by a constant $\mu$ which is called permeability. The quantities B and H are related by a simple numeric constant in the case of air where $\mu$ has a value of 1. Another quantity, magnetostatic force, is used in magnetic literature and is strictly speaking the product of magnetizing force multiplied by a length dimension. For the present, use, this length factor will be ignored and the terms magnetizing force and magnetomotive force used interchangeably and generically to indicate a generator or magnetic flux or magnetic field. In further accord with these magnetic concepts, magnetic field strength and direction are defined by the force the field produces on a magnetic north pole of unit strength. Additionally, a resultant magnetic field occurring when magnetic fields from two sources interact is determined by the relative strength of the two magnetic fields and is quantitatively defined by the vector summation of the two interacting field components or in other words, by the two force commponents acting on a unit north pole sensing element. Another magnetic concept which finds application in the present invention concerns the pattern or shape of the magnetic field lines which occur in the air gap between two magnetic poles having opposite magnetic polarity. The magnetic flux lines or magnetic field lines connecting two such poles are generally curved in nature, especially toward the exterior regions of the two pole faces, and such flux lines tend to spread out or fan out and assume an almost circular shape in the air gap between the corners of adjacent north and south magnetic poles and in the space adjacent an air gap.

Notwithstanding these magnetic relationships, any use of the term magnetomotive force, magnetic field, magnetic flux and the like, or discussion of magnetic principles in this document which are in conflict with to accepted practices in the magnetic art are not to be construed as limitations of the disclosure or the claims herein. The relationships and definitions of terminology appropriate to magnetic apparatus are known in the art and are also described inter alia in the textbook *Electrical Circuits and Machinery*, Wiley, 1949, which is hereby incorporated by reference; with such references and notice the terminology employed in describing the invention is believed conprehendable by persons skilled in the art.

Figure 2:
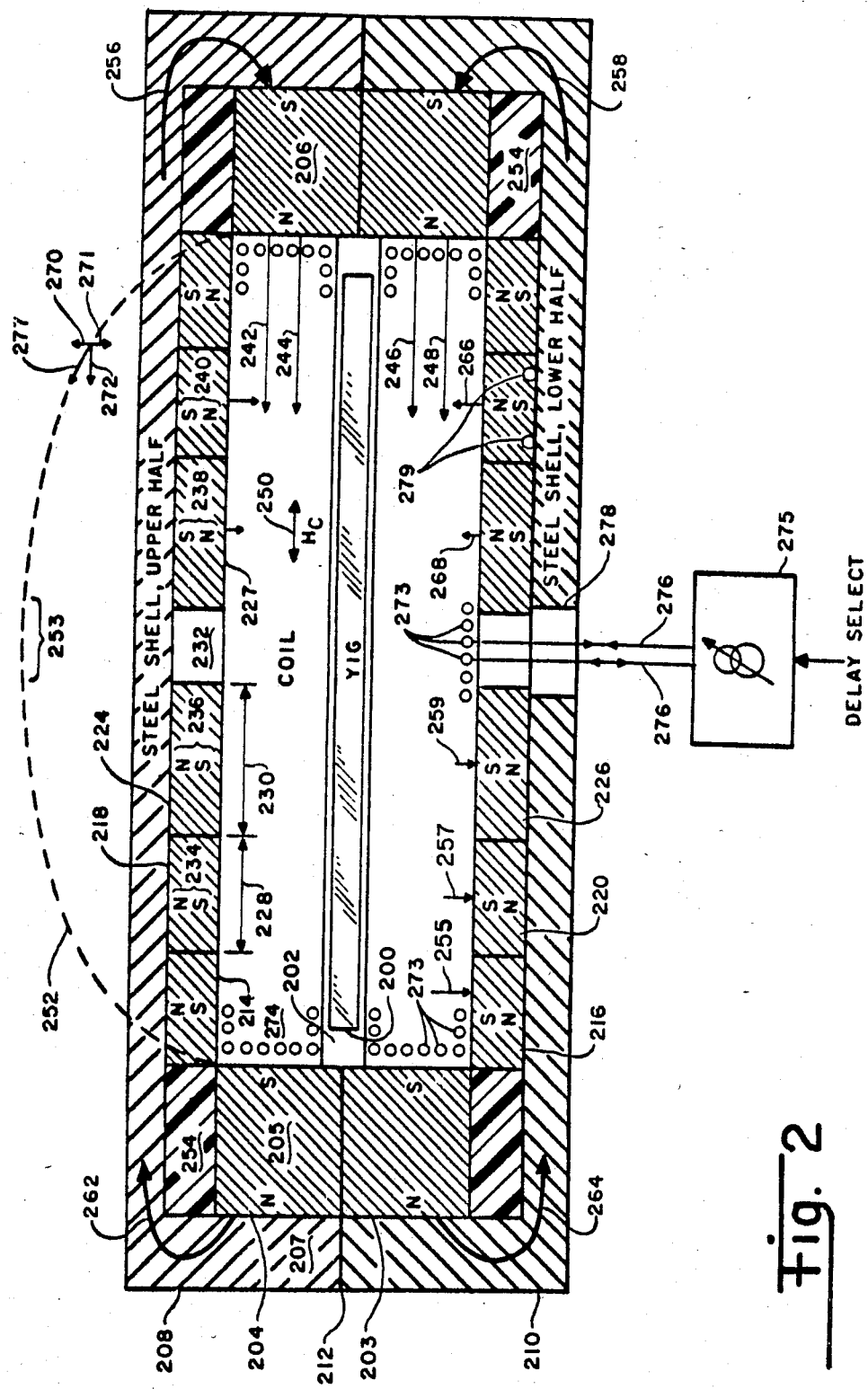
FIG. 2 is a cutaway cross-sectional view of a magnetostatic backward volume delay line such as is described in FIG. 1.

An arrangement for achieving the desired long, narrow and uniform magnetic field desired for a backward volume wave (MSBVW) delay line is shown in FIG. 2 of the drawings. In FIG. 2 there are shown two primary sources of magnetomotive force 205 and 206 which are located at opposite ends of a cavity 202 and surrounded by upper and lower halves 208 and 210 of a magnetically-conductive shell 207. The upper and lower halves of the magnetically-conductive shell and the primary magnetomotive force sources 205 and 206 meet at an interface junction 212. The interface junction 212 allows separation of the upper and lower shell halves 208 and 210 for insertion of the other FIG. 2 elements.

The FIG. 2 apparatus further includes a delay line element 200 which is received in the cavity 202, an electromagnetic coil 274 which includes a plurality of winding turns 273 and a collection of magnetomotive force generating elements 214, 216, 218, 220, 224, 226, 227, and so on, dispersed along the length of the cavity 202 and the delay line element 200 at the outer periphery of the electromagnetic coil 274. A slot or hole 278 is used to convey a pair of leads 276 between a source of controllable current 275 and the winding turns 273.

Also indicated in FIG. 2 are the magnetic field lines 242, 244, 246, and 248 existing in the space within and surrounding the cavity 202 and the delay line element 200. These magnetic field lines are the resultant of the magnetic field produced by the magnetomotive force sources 205 and 206 in combination with the dispersed magnetomotive force sources 214, 216, 218, 220, 224 and 227.

The nature of the vector summation of magnetic field line components to form one portion of the field line 252 is indicated by the vectors 270, 271 and 272 in FIG. 2. In this vector summation the vector 270 represents the vertical component of the natural magnetic field line 252, the vector 271 represents the magnitude of the magnetic field component from the dispersed magnetomotive force generating elements 214, 216, 218, 220, 224 and 227 and the vector 272 represents the horizontal component of the magnetic field line 252 respectively. Vector summations of the FIG. 2 illustrated type could of course be shown all along the field line 252—with changing relative vector lengths according to the local slope of the field line—as will be appreciated by persons skilled in the magnetic art.

The path of the magnetic flux within the upper and lower halves of the magnetically conductive shell 207 is indicated by the arrows 256, 258, 262 and 264, the magnetic flux flowing along the path indicated by these arrows resulting from both the primary magnetomotive force sources 205 and 206 and the dispersed magnetomotive force generating elements 214, 216, 218, 220, 224 and 227. The total magnetic flux existing in the upper and lower half shells 208 and 210 is also the result of additional magnetomotive force generating elements not shown in FIG. 2, but indicated in FIG. 3 which lie in front of and behind the cavity 202 and the delay line element 200. The spaces 254 shown at the corners of the magnetically conductive shell 207 are filled with some non-magnetic material such as an organic compound or air and are provided to preclude magnetic shorting of the north and south poles of the primary magnetomotive force sources 205 and 206. The magnetically-conductive shell 207 provides magnetic shielding of the delay line apparatus from noise and other stray magnetic signals in addition to providing the flux return path for the enclosed magnetomotive force sources.

Additionally shown in FIG. 2 is a double-ended arrow 250 which represents the magnetizing force provided by the electromagnetic coil 274. The double-ended nature of the arrow 250 indicates that the magnetizing force produced by the coil 274 and current from the source 275 in the windings 273 can either add to or subtract from the magnetic flux in the cavity 202 surrounding the delay line element 200.

The relative strength, and polarity of the dispersed magnetomotive force generating elements 214, 216, 218, 220, 224 and 227 are indicated in FIG. 2 by the length and direction of the arrows 255, 257, 259 and by the similar arrows for other of the dispersed magnetomotive force generating elements, in FIG. 2. The polarity of the dispersed magnetomotive force generating elements is indicated by the polarity indications typified at 234, 236, 238 and 240 and the width of each of the elements is indicated by the typical width dimension indicators 228 and 230

The development of the long, narrow and uniform magnetic field needed for the backward volume wave operating mode in the delay line element 200 is based on the diversion or vector summation of the magnetic field produced by the primary sources 205 and 206 with dispersed magnetomotive force elements 214, 216, 218, 220, 224 and 227 as is suggested by the vectors 270, 271, 272 and 277. According to the diversion conception of the FIG. 2 apparatus the magnetic field of the dispersed elements 214, 216, 218, 220, 224 and 227 causes the field from the primary sources 205 and 206 to be diverted from a normal curving path of the type indicated at 252 to the laminar or parallel field indicated at 242, 244, 246 and 248. According to the vector summation concept the vertical components of the natural magnetic field line 252 i.e., the component 270, is cancelled by the vertical component 271 from the distributed element 227.

In either of these explanations of the FIG. 2 apparatus, it should be understood, of course, that the natural magnetic field line 252 is but representative of the family of such lines which would completely represent the magnetic field between primary sources 205 and 206. Generally, each line in such a family of natural field lines would have the common characteristics of being essentially flat or of zero slope in a central portion 253 and having maximum rate of curvature at the ends adjacent the primary sources 205 and 206. The strength, width and spacing of the dispersed magnetomotive force generating elements 214, 216, 218, 220, 224 and 227 is arranged in response to these characteristics of the natural magnetic field line 252 and its unshown family counterparts; that is, the magnetic field developed by the dispersed elements 214–227 is graduated in strength, as indicated by the length of the arrows 255, 257, 259, 266 and 268, the stronger dispersed element field being located in the regions of greatest curvature of the natural magnetic field lines, adjacent the primary sources 205 and 206. Such variations in the magnetic field produced by the dispersed elements 214, 216, 218, 220, 224 and 227 can of course be arranged by fabricating the dispersed elements 214, 216, 218, 220, 224 and 227 from differing magnetic materials, and by selecting the width of each element as indicated at 228 and 230 to step-wise correct for the changes in curvature of the line 252.

A graduated embodiment of the dispersed elements 214, 216, 218, 220, 224 and 227 in FIG. 2 could also be arranged using magnetic rubber or magnetically-impregnated vinyl materials such as are manufactured by the Minnesota Mining and Manufacturing Company (3M Corporation) of Minneapolis, Minn. wherein individual magnetic domains are spaced with varying density according to the localized slope of the natural magnetic field line 252. Since the magnetic field uniformity increases with increased numbers of dispersed magnetic field sources, material of this type may be desirable in critical embodiments of the invention.

The polarity of the dispersed magnetomotive force generating elements 214, 216, 218, 220, 224 and 227 changes at the center of the distance between the primary magnetomotive force sources 205 and 206 as is indicated representatively by the polarity markings 234, 236, 238 and 240. In the central portion of the natural magnetic field line 252, the portion indicated at 253, the slope of the magnetic field line is correct for use with the delay line element 200 and no diversion or cancellation of the magnetic field is required; this condition is responsible for the gap or non-magnetic portion 232 in the dispersed elements in FIG. 2.

Both the primary sources 205 and 206 and the dispersed magnetomotive force generating elements 214–227 are represented as permanent magnets in FIG. 2. Such magnets are, of course, one possibility for achieving the invention; the illustrated permanent magnets may be replaced with electromagnets, or as indicated above, distributed magnets, especially in the case of the elements 214, 216, 218, 220, 224 and 227 if desired.

As was described in connection with FIG. 1, control of the delay in a cascaded pair of MSBVW and MSSW or MSFVW delay lines can be achieved through magnetic field variation attending the MSBVW delay line. Magnetic field variation is provided in the FIG. 2 apparatus by the electromagnetic coil 274 in response to a controllable current provided by the source 275. The magnetomotive force developed by this electromagnetic coil is indicated at 250 in FIG. 2; this magnetomotive force is arranged to either enhance or subtract from the field produced by the primary sources 205 and 206.

Delay variations in the range of ±50 nanoseconds can be achieved with magnetic field variations between approximately 690 gauss and 530 gauss according to one arrangement of the FIG. 2 apparatus. Phase deviations from linearity in the range of 17 degrees across a bandwidth of 300 MHz along with 43 nanoseconds of delay time differential are achievable as a result of magnetic field variations of 140 gauss in different embodiments of the FIG. 2 apparatus. Insertion losses in the order of 40 dB across the band and delay ripple in the order of ±6 nanoseconds are also possible with the FIG. 2 apparatus; with better impedance matching and improved manufacturing techniques, known in the delay line art, improvements in these quantitative measurements are to be expected.

The electromagnetic coil 274 supplies the differential magnetizing force 250 for adjusting the delay time of the delay line element 200; this coil is preferably arranged to modulate a 600 oersted uniform tubular field between values of 550 and 650 oersteds. The cavity 200 receiving this field has a cross-sectional dimension in the range of 1.2 millimeters×6.5 millimeters and a length in the order of 25 millimeters. To achieve a ±50 oersted field, for example, a 100 ampere turn per inch magnetomotive force is desirable, such a field is attainable with a coil of 180 turns of #24 AWG magnet wire carrying a current in the range of 0.5 to 0.6 ampere with a dissipation of about 0.2 watt in a coil resistance of 0.6 ohm. A coil of this type will have an inductance of about 60 microhenries and an inductive time constant of about 100 microseconds. This time constant is determinative of the time required to change the delay realized by the delay line between two different values. Shorter delay change times can be achieved by "forcing" the current in the coil by using larger supply voltages and electrical resistance in series with the coil as is known in the electrical transient art.

The view in FIG. 2 is actually an enlarged representation of an MSBVW delay line; and in view of this relatively small size of the FIG. 2 apparatus, forced cooling may be desired in order that delay line temperature variations and temperature-induced changes in the field strength of the ferrite magnets in the primary or dispersed magnetomotive force generating elements 205, 206 and 214, 216, 218, 220, 224 and 227 be limited. A need for this cooling can be understood by realizing that some magnetic materials display temperature sensitivity that is on the order of 0.2% per degree celsius.

The current supplied by the source 275 may also be varied in response to temperature in order to compensate for magnetic field and delay line characteristic variations. Since the magnetic flux variations provided by the electromagnetic coil 274 have a first order relationship with the current in windings 273, and the power dissipation in windings 273 has a second order relationship with the current, delay time corrections in the FIG. 2 apparatus involving larger currents in windings 273 are achieved at the expense of larger power dissipations and increased need for cooling of the FIG. 2 apparatus.

Depending upon the degree of magnetic field linearity variation that can be accepted in a particular embodiment of the FIG. 2 apparatus, it may be necessary to compensate the strength of the dispersed magnetomotive force generating elements 214, 216, 218, 220, 224 and 227 for variations in the linear field lines 242, 244, 246 and 248 that are provided by the electromagnetic coil 274. In other words, changes in the linear field may also necessitate changes in the strength of the magnetomotive force developed by the dispersed magnetomotive force generating elements. This compensation is secondary in nature, since the electromagnetic coil 274 provides principally magnetomotive force that is parallel to the desired field lines 242, 244, 246 and 248. Such compensation, if needed, may be provided by an additional set of electromagnetic coils 279 located in conjunction with the dispersed elements 214, 216, 218, 220, 224 and 227 so as to modulate the magnetic field produced by these dispersed elements.

FIG. 3 of the drawings is a cut-away cross-sectional view that shows the cut elements with hatched cross-sectioning and also shows elements lying behind the cutting plane without cross-sectioning. In FIG. 3 the upper and lower half-shells 208 and 210 are shown along with the interface junction 212 at which upper and lower shells and upper and lower halves of the primary magnetomotive force sources 205 and 206 meet. FIG. 3 also shows the desired polarity of the behind the cutting plane (i.e., below the plane of FIG. 3), or side shell located magnetomotive force sources at 308, 310, 312 and 314, the desired polarity is different on opposing sides of the gap or non-magnetic element 232, as indicated at 308, 310 and 312, 314.

The FIG. 3 representation omits the delay line 200, the electromagnetic coil 274 and other portions of the FIG. 2 apparatus in order to more clearly show the arrangement of the dispersed magnetomotive force generating elements 300, 302, 304 and 306 behind or below the cutting plane. FIG. 3 parts not shown in FIG. 2 are represented by numbers in the 300 series. As indicated by the MMF generating elements 300, 302, 304 and 306 in FIG. 3, it is desirable for the diversion or vector cancellation effect of the dispersed magnetomotive force generating elements to completely surround the cavity 202 and the delay line element 200 in order that the generated magnetic field be fully laminar or parallel in all directions around the delay line element. The elements 300, 302, 304 and 306 in FIG. 3 are similar in concept to the elements 214, 216, 218, 220, 224 and 227 described in connection with FIG. 2 but are, however, located on the sides of the magnetically conductive shell.

The material composing the half shells 208 and 210 may be, for example, comprised of nickel-irol steel, other materials such as the numerous commercially-available magnetic alloys could also be used. The primary magnetomotive source elements 205 and 206 and the dispersed magnetomotive force generating elements 214–227 and 300–306 in FIG. 3 can be fabricated from a variety of materials when embodied in the illustrated permanent magnet form. Such materials as the commercially available ALNICO 8 or INDOX 5 permanent magnet alloys or low energy ceramic magnets are suitable for these elements. The names ALNICO 8 and INDOX 5 are trademarks.

As was indicated above, the present invention contemplates a cascade combination of a backward volume wave magnetostatic delay element having the long, narrow, uniform tubular, surrounding magnetic field with a magnetostatic surface wave or magnetostatic forward volume wave element in order to achieve dispersion cancellation. A magnetic circuit arrangement suitable for operating the magnetostatic surface wave or forward volume wave element in this cascade combination is shown in FIG. 4 of the drawings. FIG. 4 includes a lateral cross-section view 400 and an end cross-sectional view 402. The delay line element 408 in FIG. 4 is shown sandwiched between two permanent magnets 404 and 410; these magnets are in turn surrounded by a magnetically conductive shell 406 similar to the shell 207 employed in the FIG. 2 apparatus. The achievement of a magnetic flux pattern suitable for operating the megnetostatic surface wave or magnetostatic forward volume wave delay line elements is relatively straightforward in the magnetic art since these elements require only moderate magnetic field strength and the desired field is directed transversely of the thin delay line element 408. Such fields are readily attained with the structure shown in FIG. 4. The shell 406 in FIG. 4 may be fabricated in one or two segments as desired, the interface junction 212 in FIG. 2 is unnecessary in FIG. 4 in view of the possible end access to the shell interior that was absent in the FIG. 2 and FIG. 3 apparatus. As indicated at 412 in FIG. 4, the shell 406 may be fabricated from a steel alloy such as the type 4750 Magnetic Steel which is available from several commercial suppliers.

Several variations of the disclosed apparatus are within contemplation of the invention. One such variation of course involves the selection of delay line element material, the indicated yttrium iron garnet is but representative of possible materials for this element. A discussion of possible other materials is to be found in the above-referenced U.S. Pat. No. 3,480,888 of W. S. Elliott in column 3, line 48; the disclosure of this patent is hereby incorporated herein by reference.

Another variation in the disclosed apparatus involves the consideration of ground plane effects from either an intentionally incorporated or an inherently included ground plane adjacent the delay line element 200. A combination of a ground plane and an adjustable magnetostatic backward volume wave delay line as described herein is of course feasible.

An arrangement for coupling the radio frequency signal to be delayed and for receiving the delayed signal through the shell of the delay line structure has been omitted from the present description; suitable arrangements of the interface between shell halves or other signal entry into the shell are within the capability of persons skilled in the art.

While the apparatus and method herein described constitute a preferred embodiment of the invention, it is to be understood that the invention is not limited to this precise form of apparatus or method, and that changes may be made therein without departing from the scope of the invention, which is defined in the appended claims.

I claim:

1. Controllable laminar magnetic flux generating apparatus comprising:

first and second sources of magnetomotive force located at two displaced points along an axis and polarized to establish magnetic field flux lines starting at said first source, tending to extend along said axis in an outward curving line pattern, having flux line components both parallel and perpendicular to said axis and ending at said second source;

a third distributed element controllable source of magnetomotive force located in lengthwise dispersion along said axis between said first and second sources for subtractively and additively modulating the strength of said first and second source magnetic field flux lines in response to a control signal;

means located along said axis for diverting said magnetic field flux lines from said curving line pattern to a pattern of flux lines extending parallel to said axis between said first and second sources; and a cavity receptacle concentric with said axis and communicating therealong between said first and second sources.

2. The apparatus of claim 1 wherein said means for diverting includes fourth magnetomotive source means dispersed along said axis and radially about said axis for generating magnetic field lines that are orthogonally oriented with respect to said axis and said cavity receptacle.

3. The apparatus of claim 2 wherein said fourth magnetomotive source means is physically dispersed along said axis in accordance with a predetermined relationship between axial position and orthogonal field intensity with greatest fourth source orthogonal field intensity located adjacent said first and second magnetomotive sources.

4. The apparatus of claim 3 wherein said first and second sources comprise magnets located at opposite ends of said cavity and having poles of opposite polarity facing the interior of said cavity.

5. The apparatus of claim 4 wherein said third controllable source of magnetomotive force includes an electromagnetic coil concentric with and toroidially surrounding said cavity and capable of generating magnetomotive force aiding and opposing the magnetomotive force of said first and second sources in response to selected polarity and magnitudes of an applied electrical current which comprises said control signal.

6. The apparatus of claim 5 wherein said dispersed fourth magnetomotive source includes a region of substantially zero orthogonal field component intensity located midway along said axis between said first and second sources.

7. The apparatus of claim 6 wherein said first and second source magnets and said dispersed fourth magnetomotive source means each include permanent magnets.

8. The apparatus of claim 7 wherein said dispersed fourth magnetomotive force means permanent magnets are disposed in a closed cross-section polygon extending along said axis.

9. The apparatus of claim 8 wherein said dispersed fourth magnetomotive force means permanent magnets extending along said axis define a closed polygon having a cross-section of larger diameter than said electromagnetic coil and substantially surrounding said electromagnetic coil.

10. The apparatus of claim 9 further including magnetic flux conductive enclosure means of closed polyhedral configuration surrounding said apparatus external of said fourth magnetomotive force means for conducting magnetic return flux from said magnets and for magnetically shielding said apparatus from stray signals.

11. The apparatus of claim 10 further including a magnetostatic wave delay line received lengthwise along said axis within said cavity.

12. The apparatus of claim 11 wherein said delay line is fabricated from yttrium iron garnet material.

13. Magnetostatic delay line apparatus comprising:
means including a primary source of magnetomotive force for generating curved magnetic field flux lines extending from terminus in said source lengthwise along an axis intersecting said source, said flux lines having vector components that are both parallel with and perpendicular to said axis, with said perpendicular components varying in magnitude with position along said axis;
means located along said axis for generating magnetic flux that is perpendicular to said axis, opposite in polarity to said position varying perpendicular flux components and of predetermined strength for cancelling said axial position varying perpendicular flux components, thereby leaving flux components that are parallel with said axis; and
a backward volume wave magnetostatic delay line element lengthwise located in said parallel flux component magnetic field.

14. The delay line apparatus of claim 13 wherein said primary source of magnetomotive force includes a source of fixed strength magnetomotive force and a source of controllable strength magnetomotive force.

15. The delay line apparatus of claim 14 wherein said primary source of magnetomotive force includes first and second permanent magnets located at displaced positions along said axis at opposite ends of said delay line element.

16. The delay line apparatus of claim 15 wherein said controllable strength source of magnetomotive force includes an electrically energized winding capable of modulating the magnetomotive force generated by said permanent magnets.

17. The delay line apparatus of claim 16 wherein said delay line elements are composed of Yttrium Iron Garnet material.

18. The delay line apparatus of claim 16 wherein said means located along said axis for generating perpendicular magnetic flux includes a plurality of axially spaced magnetic domains circumferentially disposed of said axis.

19. The apparatus of claim 16 further including electric circuit means connected with said electrically energized winding for controlling the current in said winding in response to a delay time selection signal.

20. Magnetostatic delay line apparatus comprising:
means including a primary source of magnetomotive force for generating curved magnetic field flux lines extending lengthwise along an axis intersecting said source, said curved flux lines having vector components that are both parallel with and perpendicular to said axis with said perpendicular components varying in magnitude with position along said axis,
said primary source of magnetomotive force including first and second permanent magnets located at displaced positions along said axis at opposite ends of an axially disposed cavity,
said primary source of magnetomotive force also including an electrically energized winding source of controllable strength magnetomotive force capable of modulating the magnetomotive force generated by said permanent magnets;
means located along said axis for generating magnetic flux that is oriented perpendicular to said axis, opposite in polarity to said position varying perpendicular flux components and of predetermined strength to cancel said axial position varying perpendicular flux components, thereby leaving flux components that are parallel with said axis;
a backward volume wave magnetostatic delay line element lengthwise located in said axially disposed cavity in said parallel flux component magnetic field;
a magnetostatic surface wave delay line element connected in signal path series with said backward volume wave delay line element; and
means for generating magnetic flux capable of magnetically biasing said magnetostatic surface wave element into a predetermined magnetic operating mode.

21. Magnetostatic delay line apparatus comprising:
means including a primary source of magnetomotive force for generating curved magnetic field flux lines extending lengthwise along an axis intersecting said source, said curved flux lines having vector components that are both parallel with and perpendicular to said axis with said perpendicular components varying in magnitude with position along said axis,
said primary source of magnetomotive force including first and second permanent magnets located at displaced positions along said axis at opposite ends of an axially disposed cavity,
said primary source of magnetomotive force also including an electrically energized winding source of controllable strength magnetomotive force capable of modulating the magnetomotive force generated by said permanent magnets;
means located along said axis for generating magnetic flux that is oriented perpendicular to said axis, opposite in polarity to said position varying perpendicular flux components and of predetermined strength to cancel said axial position varying perpendicular flux components, thereby leaving flux components that are parallel with said axis;
a backward volume wave magnetostatic delay line element lengthwise located in said axially disposed cavity in said parallel flux component magnetic field;
a magnetostatic forward volume wave delay line element connected in signal path series with said backward volume wave delay line element; and
means for generating magnetic flux capable of magnetically biasing said magnetostatic forward volume wave element into a predetermined magnetic operating mode.

* * * * *

UNITED STATES PATENT AND TRADEMARK OFFICE
CERTIFICATE OF CORRECTION

PATENT NO. : 4,605,911

DATED : August 12, 1986

INVENTOR(S) : Korda K. Jin

It is certified that error appears in the above-identified patent and that said Letters Patent is hereby corrected as shown below:

At column 1, line 65, "patent" should read --patented--.

At column 2, line 49, "magentic" should read --magnetic--.

At column 3, line 32, --generated-- should follow "externally".

At column 8, line 23, "214-227" should read --214, 216, 218, 220, 224 and 227--.

At column 8, line 62, "214-227" should read --214, 216, 218, 220, 224 and 227--.

At column 10, line 33, "or" should be deleted.

At column 10, line 62, "214-227" should read --214, 216, 218, 220, 224 and 227--.

At column 10, line 62, "300-306" should read --300, 302, 304 and 306--.

At column 12, claim 5, line 3, "toroidially" should read --torroidially--.

Signed and Sealed this

Second Day of December, 1986

*Attest:*

DONALD J. QUIGG

*Attesting Officer*     *Commissioner of Patents and Trademarks*